United States Patent [19]

Solie

[11] 4,319,154

[45] Mar. 9, 1982

[54] TEMPERATURE INSENSITIVE REFLECTIVE ARRAY S.A.W. DEVICE

[75] Inventor: Leland P. Solie, Acton, Mass.

[73] Assignee: Sperry Corporation, New York, N.Y.

[21] Appl. No.: 106,953

[22] Filed: Dec. 26, 1979

[51] Int. Cl.³ .............................................. H01L 41/08
[52] U.S. Cl. .................................. 310/313 D; 333/195
[58] Field of Search ....................... 310/313 R, 313 D; 333/153–155, 193, 195

[56] References Cited

U.S. PATENT DOCUMENTS

| | | | |
|---|---|---|---|
| 3,790,828 | 2/1974 | Chao | 310/313 D |
| 3,883,831 | 5/1975 | Williamson et al. | 310/313 D |
| 3,983,517 | 9/1976 | Weglein | 310/313 D |
| 3,999,147 | 12/1976 | Otto et al. | 333/155 X |
| 4,054,851 | 10/1977 | Borner et al. | 310/313 D |
| 4,166,228 | 8/1979 | Solie | 310/313 D |
| 4,206,426 | 1/1980 | Solie et al. | 333/195 |

Primary Examiner—Mark O. Budd
Attorney, Agent, or Firm—Howard P. Terry

[57] ABSTRACT

The invention provides a temperature-insensitive, reflective acoustic wave signal processor employing a trio or reflective arrays disposed effectively to rotate the direction of propagation of the acoustic wave through 180 angular degrees so that the acoustic wave in a preferred embodiment reaches the output transducer flowing in the opposite parallel direction as when launched by the input transducer.

7 Claims, 3 Drawing Figures

TEMPERATURE INSENSITIVE REFLECTIVE ARRAY S.A.W. DEVICE

BACKGROUND OF THE INVENTION

1. Field of the Invention

The present invention relates generally to surface acoustic wave signal processors and more particularly to surface acoustic wave signal processors demonstrating substantial insensitivity to variations of the ambient temperature.

2. Description of the Prior Art

Typical of prior art acoustic signal processors are reflective array devices often used in constructing band pass filters, pulse compression filters, and the like. Such devices are normally constructed at the planar surface of a piezoelectric substrate at which are formed opposed input and output interdigital metal film transducers. One or more reflecting arrays are disposed obliquely in the propagation path between the input and output transducers. Each reflective array contains a grouping of parallel reflector elements in the form of metallic surface strips or of grooves etched into the surface of the piezoelectric substrate, for example.

Typical of such prior art devices are processors in which the input transducer launches a wave along the z-axis of the substrate crystal and a single reflective array reflects the acoustic waves so as to propagate energy along the x-axis toward the output transducer. Devices of this type are described in the U.S. Pat. No. 4,055,820 to L. P. Solie for a "Reflective Dot Array for Acoustic Wave Processing", issued Oct. 25, 1977 and assigned to Sperry Corporation. Variations of such devices are also well known in which a pair of arrays is disposed so as effectively to reverse the original direction of the launched wave through 180 angular degrees.

The operating characteristics of these and other such acoustic signal processors are adversely affected by changes in the ambient temperature. So that the necessity of placing of the substrate in a temperature controlled oven may be relieved, a temperature compensated reflective array was devised, as disclosed in the L. P. Solie U.S. Pat. No. 4,166,228 for a "Temperature Compensated Reflective Array for Surface Acoustic Processing", issued Aug. 28, 1979 and also assigned to Sperry Corporation. This prior art temperature-insensitive, reflective surface wave signal processor contains an even number of pairs of cooperating reflective arrays in which successive pairs of the reflective arrays are disposed so as to rotate the direction of propagation of the acoustic wave through 180 angular degrees in opposite directions and in which the propagation path between the individual reflective arrays in each pair is minimized. In this manner, the acoustic signal reaches the output transducer flowing in the same direction as it did upon leaving the input transducer, as will be further discussed.

SUMMARY OF THE INVENTION

The invention provides an improved reflective acoustic wave signal processor employing a trio of reflective arrays disposed effectively to rotate the direction of propagation of the acoustic wave through 180 angular degrees so that the acoustic wave in a preferred embodiment reaches the output transducer flowing in the opposite parallel direction as when launched by the input transducer thus providing a device of demonstrated temperature insensitivity.

DESCRIPTION OF THE PREFERRED EMBODIMENTS

Figure 1:
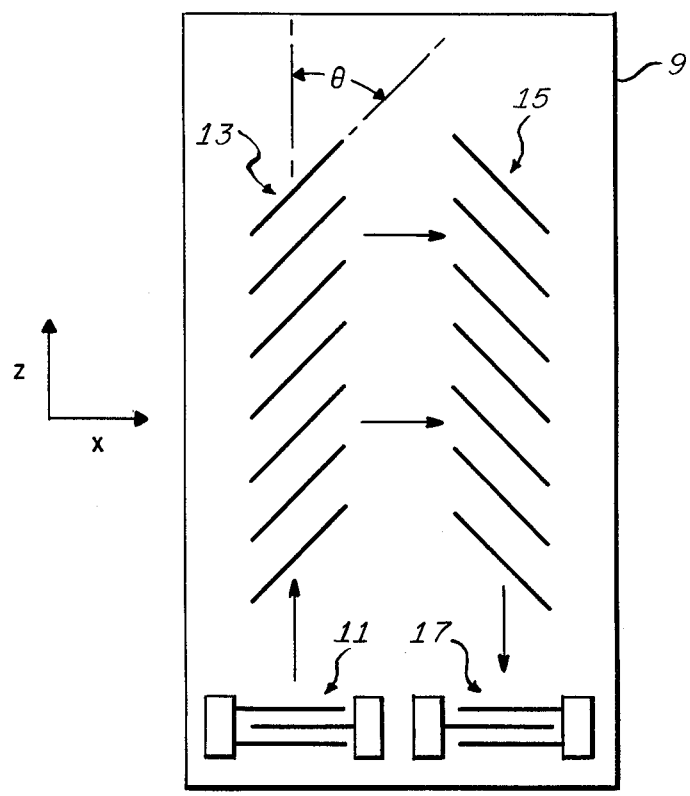
FIGS. 1 and 2 are diagrams illustrating prior art reflective array devices.

FIG. 1 illustrates a prior art acoustic wave reflective array in which a conventional interdigital input transducer 11 launches an acoustic wave along the z-axis at the surface of the piezoelectric substrate 9 toward a first reflective angled array 13. The acoustic wave reflected from array 13 is directed toward a second angled reflective array 15 from which it is reflected in the reversed direction toward an output interdigital transducer 17. An important design parameter in such reflective array devices, as explained in the aforementioned U.S. Pat. No. 4,166,228, is the angle $\theta$ between the parallel reflector elements forming each angled reflective array and the direction of energy propagation of the incoming wave. This angle is determined by the surface wave velocities $V_x$ and $V_z$ in the two orthogonal directions shown in FIG. 1 according to the relation:

$$V_x/V_z = \tan \theta.$$

The two velocities are generally different and have different dependencies upon temperature in preferred substrate materials, such as ST-cut quartz and lithium niobate.

As seen in FIG. 1, the direction of propagation of wave fronts reflected from array 13 for standard non-cubic substrates such as ST-cut quartz and lithium niobate will be dependent upon the temperature of the substrate. If the direction of propagation of the acoustic surface wave reflected from array 13 deviates from the x-axis direction, the output of transducer 17 is significantly reduced, as is well known in the prior art. In addition to the temperature dependence of the magnitude of the reflection angle, a second temperature effect is caused because of the variation in acoustic wave velocity with temperature.

Figure 2:
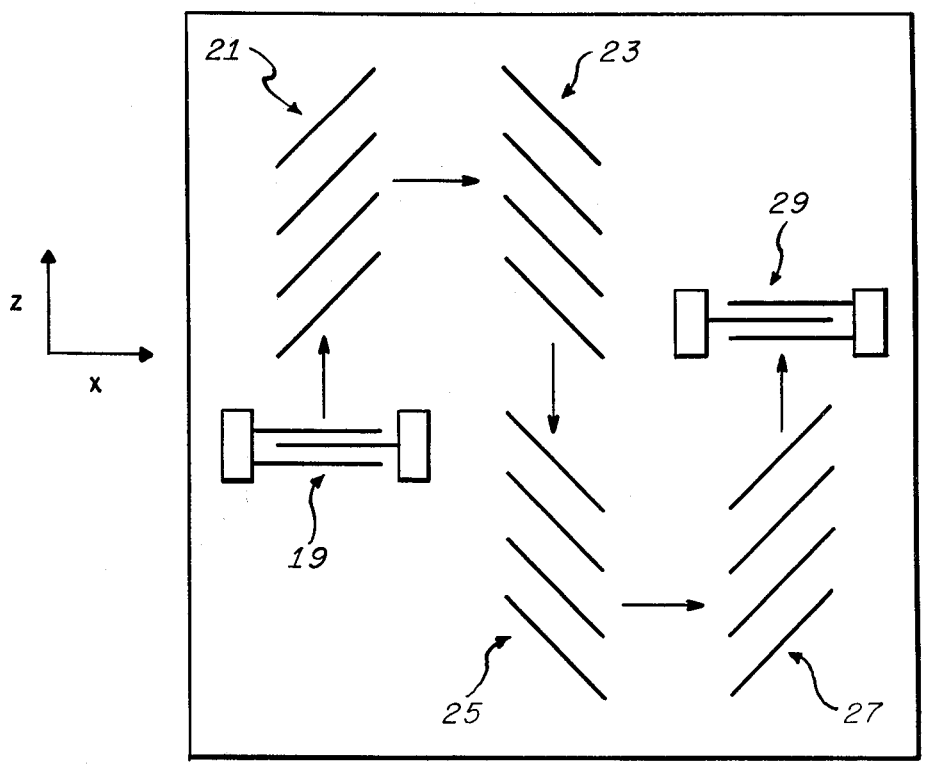

In the prior art device of FIG. 2, a double reversal of the acoustic propagation path is achieved with substantially no adverse effects with reduced ambient temperature variation. This device, discussed in further detail in the aforementioned U.S. Pat. No. 4,166,228, includes an input transducer 19 disposed to launch surface acoustic waves at the piezoelectric substrate 17 into the angled reflective array 21 and then into angled reflective array 23. The array pair 21, 23 reverse the direction of acoustic propagation into a third angled reflective array 25 similar to and aligned with array 23. Array 25 is one of a pair 25, 27 disposed so that the acoustic energy radiated from the angled reflective array 27 is directed along the z-axis into the output transducer 2 in the same direction as it originally propagated from input transducer 19.

Assume that the device of FIG. 2 is subjected to a temperature change which causes the acoustic velocity of propagation along the x-axis to increase more than the corresponding increase in the velocity of propagation along the z-axis. Then, the wave reflected from array 21 no longer propagates along the x-axis but deviates by an angle δ in the counter-clockwise direction therefrom as discussed in U.S. Pat. No. 4,166,228. Furthermore, when the wave reflected from array 21 is again reflected by array 23, the new wave is deviated from the z-axis in a clockwise direction by a total angle 2δ. As described in U.S. Pat. No. 4,166,228, the successive reflections at arrays 25 and 27 each produce a compensating deviation of δ of the wave, so that the wave reaching transducer 29 is no longer deviated. The wave reaching output transducer 29 thus remains parallel to the direction of the original wave launched by input transducer 19 over a considerable range of temperature variations experienced by substrate 17.

While the device of FIG. 2 is found widely acceptable in many applications, being temperature stable over a moderate range, input and output propagation are in the same direction, rather than in opposite directions, and the transducers are not at the same end of the substrate, as in the device of FIG. 1. Further, the prior art demonstrates certain other difficulties.

Figure 3:
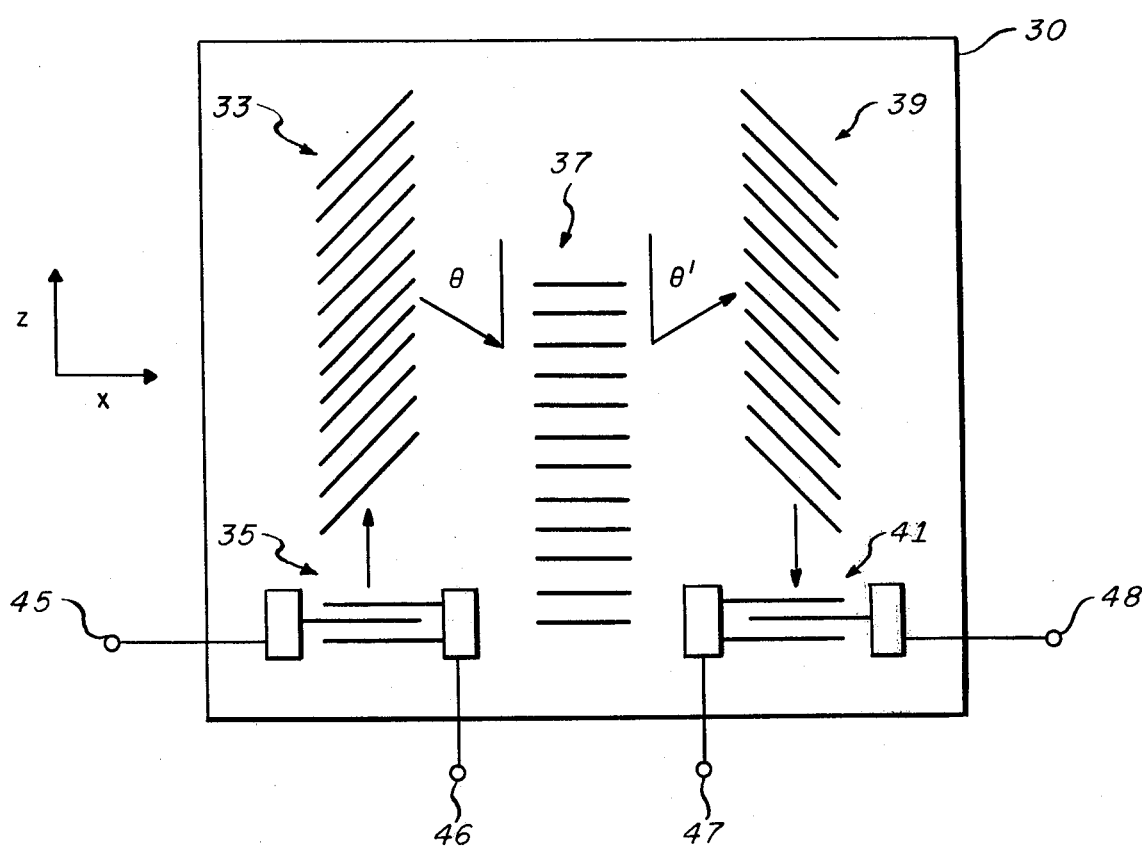
FIG. 3 is a diagram showing an embodiment of the present invention.

The generally symmetric device of FIG. 3 overcomes the aforementioned difficulties of the prior art, again being constructed on a piezoelectric substrate 30. The device of FIG. 3 proves to be much more insensitive to ambient temperature changes than does the prior art. For example, the FIG. 2 device will compensate only for small temperature changes, but that of FIG. 3 is unaffected over large ranges of temperature variations.

The central array 37 of metal reflective elements has a major longitudinal axis normally disposed along the center line of substrate 30. Angled arrays 33, 39 are symmetrically located with respect to array 37 and have longitudinal or propagation axes parallel to the major axis of array 37. The elements of the arrays 33,39 form angles, with respect to the longitudinal axis, which are equal and opposite (negative). It is to be understood that the central array 37 plays an important and novel role in the invention in that energy propagating through it must inherently emerge at an angle, with respect to the longitudinal axis, that is equal and opposite (negative) to the angle of incidence. Thus, in FIG. 3, angle $\theta$ must always be equal and negative to angle $\theta'$.

To exploit the character of the central array 37, an input transducer 35 is disposed at one end of array 33 and projects an acoustic wave into the angled reflective array 33 along its propagating axis. The wave front then propagated from central array 37 ultimately propagates into the angled reflective array 39 and then into the output transducer 41.

Thus, the configuration of FIG. 3, wherein angled output array 39 is substantially a mirror image of angled input array 33, permits the direction of propagation of acoustic energy into output transducer 41 to be the same in varying temperature condition as that of propagation of acoustic energy from input transducer 35 with the main axes of transducers 35 and 41 parallel. This conclusion does not depend upon the particular value of $\theta$ for a uniform array 33 or 39. Angle $\theta$ for a uniform array may be selected from a substantial range of values still with temperature independence. Furthermore, angle $\theta$ may vary, for instance continuously, over the length of array 33. Furthermore, the FIG. 3 device is tolerant even of local manufacturing or other irregularities which cause local variations in $\theta$; this tolerance is present because the symmetry always insures that $\theta$ and $\theta'$ are equal.

Metal film array elements are not always satisfactory for the prior art device of FIG. 1 because of diffraction effects which cause significant changes in the effective angle $\theta$ of FIG. 1. However, the symmetric geometry of the novel FIG. 3 device permits operation over a wide temperature range not affected by such diffraction effects so that the simple metal film elements are acceptable for use in arrays 33, 39. Further, the flexibility and versatility of the FIG. 3 invention is further illustrated by the fact that other types of array elements may be employed, such as metal strips, etched grooves, metal dots, etched dots, or combinations thereof. Weighting of the arrays may be accomplished in the usual manner by apodization; though diffraction effects are then caused, they are of no concern since $\theta$ and $\theta'$ are equal in any event.

The respective launching and receiving transducers 35, 41 are similar and interchangeable, since the reciprocity theorem holds with respect to their operation. One preferred form of the surface wave excitation means is illustrated in FIG. 3 in which the device consists of a pair of electrodes with respective interdigital electrode fingers of alternating instantaneous electrical polarity. Standard photoetching and photoresist masking or other known techniques may be used to fabricate a plurality of such thin conductors of the interdigital electrodes on substrate 30, which electrodes may be made of gold, aluminum, or of other electrically conducting material, and may have widths of the order of microns. The devices 35, 41 may be formed as a thin overlay on the surface of substrate 30, or may be inlayed flush with the surface of substrate 30. Adjacent electrode fingers of any one electrode are spaced substantially one wave length apart at the center of the operating carrier frequency range. The electrode devices 35, 41 act generally as end fire arrays, propagating a desired forward surface acoustic wave when driven by signals which may be passed through a conventional matching network and signal source (not shown) coupled to leads 45, 46 or 47, 48. Since the reciprocity theorem evidently applies to the exciter 35 of FIG. 3, a similarly constructed electrode system may act as a surface acoustic wave receiver, coupling to the traveling electric field associated with the flowing surface elastic wave, and thereby yielding a useful electrical output on leads 47, 48 for further signal processing.

In general, non-cubic piezoelectric materials again are used as the substrate 30 such as quartz or lithium niobate and transducers 35, 41 may be aligned for propagation in any one convenient direction for surface wave excitation of substrate 30. For lithium niobate, the substrate 30 is y-cut with propagation parallel to the crystalline z-axis and is ST-cut for quartz for propagation in the x-axis direction. In the case of ST-cut quartz, temperature delay dependence may be further diminished by minimizing the propagation time between angled reflective arrays 33, 39 with arrays 33, 39 oriented along the substantially temperature independent direction of substrate 30.

Although the foregoing description has dealt with M-shaped configurations having three symmetrically disposed arrays, it will be understood that the invention may readily be extended so that the propagation path consists of a series of two or more M-shaped paths. In general, the invention requires the use of 3N signal processing arrays inserted between input and output transducers, where N is an integer. The geometry of the invention is such that the outgoing wave is exactly parallel to the incoming wave regardless of temperature variation. Thus, the critical alignments of the prior art are avoided which make the performance of prior art devices dependent on temperature, on minor variations from one substrate to another, and on minor variations in the structure or use of masks and other manufacturing steps.

While the invention has been described in its preferred embodiments, it is understood that the words which have been used are words of description rather than of limitation and that changes within the purview of the appended claims may be made without departure from the true scope and spirit of the invention in its broader aspects.

What is claimed is:

1. Acoustic wave processing apparatus comprising:
   substrate means for supporting acoustic waves at a surface thereof,
   acoustic wave reflective array means having a longitudinal axis and elements disposed substantially perpendicular to said longitudinal axis, adapted to convert an acoustic wave incident thereto at an angle into an acoustic wave reflected at an emergent angle substantially equal and opposite to said incident angle,
   first and second acoustic wave propagation array means disposed parallel to and equally spaced from said acoustic wave reflective array means,
   said first acoustic wave propagation means being adapted to convert acoustic wave energy propagating substantially parallel to said longitudinal axis into said wave incident at said angle to said acoustic wave reflective array means, and
   said second acoustic wave propagation means being adapted to convert said wave reflected at said emergent angle from said acoustic wave reflective means into an acoustic wave propagating substantially parallel to said longitudinal axis, whereby propagation angles of acoustic waves emerging from said second acoustic wave propagation means are substantially independent of temperature variations of said acoustic wave processing apparatus.

2. Apparatus as described in claim 1 wherein said first acoustic wave propagation means includes a substantially parallel elements disposed at a first angle to said longitudinal axes to form a first array means.

3. Apparatus as described in claim 2 wherein said second acoustic wave propagation means includes substantially parallel elements disposed at a second angle to said longitudinal axes that is negative to said first angle to form a second array means.

4. Apparatus as described in claims 2 or 3 further including first and second transducer means positioned on said substrate means for respectively exchanging acoustic energy with said first and second acoustic wave propagation array means.

5. Apparatus as described in claim 2 wherein:
   said first and second transducer means include substantially parallel interdigital electrode means, and
   said acoustic wave reflective array means includes array elements substantially parallel to said interdigital electrode means.

6. Apparatus as described in claim 5 wherein said first and second acoustic wave propagation array means include array elements disposed in angular relation to said interdigital electrode means.

7. Apparatus as described in claim 6 wherein said array elements of said first acoustic wave propagation means are disposed at an angle to said interdigital electrode means and wherein said array elements of said second acoustic wave propagation means are disposed at an angle with respect to said interdigital electrode means that is equal and opposite said angle at which said first acoustic wave propagation means are disposed to said interdigital electrode means.

* * * * *